United States Patent [19]
Nitta

[11] Patent Number: 5,994,753
[45] Date of Patent: Nov. 30, 1999

[54] SEMICONDUCTOR DEVICE AND METHOD FOR FABRICATING THE SAME

[75] Inventor: Yoshiki Nitta, Tokyo, Japan

[73] Assignee: Oki Electric Industry Co., Ltd., Tokyo, Japan

[21] Appl. No.: 09/042,013

[22] Filed: Mar. 13, 1998

[30] Foreign Application Priority Data

Mar. 18, 1997 [JP] Japan ..................................... 9-064522

[51] Int. Cl.⁶ ................................................ H01L 27/095
[52] U.S. Cl. ........................... 257/471; 257/472; 438/72; 438/570; 438/573; 438/574; 438/576; 438/579
[58] Field of Search .................................. 438/182, 197, 438/230, 259, 570, 574, 575, 576, 579; 257/256, 471, 472

[56] References Cited

FOREIGN PATENT DOCUMENTS 5-160019  6/1993  Japan .
6-260509  9/1994  Japan .

OTHER PUBLICATIONS

Wolf, S., Tauber R.N.; Silicon Processing for the VLSI Era vol. 1: Process Technology, Lattice Press, Sunset Beach, CA, pp. 429–446, Jan. 1986.

*Primary Examiner*—John F. Niebling
*Assistant Examiner*—Christopher Lattin
*Attorney, Agent, or Firm*—Rabin & Champagne, P.C.

[57] ABSTRACT

In a method for fabricating a semiconductor device, an insulating layer is formed on a semiconductor substrate, then a resist layer is formed on the insulating layer to have an opening therein. Next, removing the insulating layer at the bottom of the opening, then a reflow process is performed to the resist layer to have a curved surface thereon.

14 Claims, 11 Drawing Sheets

SEMICONDUCTOR DEVICE AND METHOD FOR FABRICATING THE SAME

CROSS REFERENCE TO RELATED APPLICATION

This application claims the priority of Application No. H09-064522, filed Mar. 18, 1997 in Japan, the subject matter of which is incorporated herein by reference.

TECHNICAL FIELD OF THE INVENTION

The present invention relates to a semiconductor device and a method for fabricating thereof, and more particularly to a method for fabricating an FET (Field Effect Transistor) with a T-shape gate electrode.

BACKGROUND OF THE INVENTION

In fabrication of an FET, such as an FET with a T-shape short gate electrode and an FET with a heterojunction, a reflow process is performed in order to improve the quality of those FETs. The reflow process is performed to an insulating layer, for example, to avoid breaking of the gate electrode, and to improve the uniformity of etching with a fine pattern.

Conventional methods for fabricating an FET are, for example, described in Japanese Patent Publications, Koukoku, H8-15161 and Laying Open, Kokai, H5-160019. According to a method described in Koukoku H8-15161, a first resist layer is formed on a semiconductor substrate to have a first gate opening. Then, the semiconductor substrate is etched at the bottom of the first gate opening to have a recess-etching surface, and the first resist layer is removed. Next, an insulating layer is formed over the entire surface of the structure, and a second resist layer is formed on the insulating layer to have a second gate opening. Then, a reflow-process is performed to the second resist layer to have a curved surface, and the insulating layer is removed at the bottom of the second gate opening. After that, a metal layer is formed in the second gate opening, and the second resist layer is removed to form a gate electrode.

According to the conventional method, the insulating layer is removed after the reflow-process, and therefore, the gate length (channel length) may be changed during the step of removing the insulating layer. As a result, the pattern shift varies, and therefore, the characteristics of the semiconductor device may be varied. Such a problem are occurred as well in the conventional method shown in Kokai H5-160019. The pattern shift means the difference in size between the original gate pattern and the actual gate length. In general, the pattern shift occurs in every kind of etching process. In fabrication of a gate electrode, however, it is required to make the pattern shift consistent to control the size of gate length precisely.

OBJECTS OF THE INVENTION

Accordingly, an object of the invention is to provide a semiconductor device which has stable characteristics.

Another object of the invention is to provide a method which can fabricate a semiconductor device having stable characteristics.

Still another object of the invention is to provide a field effect transistor (FET) which has an optimum gate-length (channel length).

A further object of the invention is to provide a method which can fabricate a field effect transistor (FET) having an optimum gate-length (channel length).

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the invention, in a method for fabricating a semiconductor device, an insulating layer is formed on a semiconductor substrate, then a resist layer is formed on the insulating layer to have an opening therein. Next, removing the insulating layer at the bottom of the opening, then a reflow process is performed to the resist layer to have a curved surface thereon.

A semiconductor device, according to a second aspect of the invention, is fabricated by the above described method of the first aspect of the invention.

According to a third aspect of the invention, a method for fabricating a field effect transistor, includes the steps of providing a semiconductor substrate; forming an ohmic electrode on the semiconductor substrate; forming a first resist layer over the entire surface of the structure to have a first opening therein; etching the source of the semiconductor substrate at the bottom of the first opening to form a recess-etching surface; removing the first resist layer; forming an insulating layer over the entire surface of the structure; forming a second resist layer over the entire surface of the structure to have a second opening therein; removing the insulating layer at the bottom of the second opening; performing a reflow process to the second resist layer to have a curved surface; and forming a gate electrode to be connected to the recess-etching surface of the semiconductor substrate.

A field effect transistor, according to a fourth aspect of the invention, is fabricated by the above described method of the third aspect of the invention.

DETAILED DISCLOSURE OF THE INVENTION

Figure 1A:
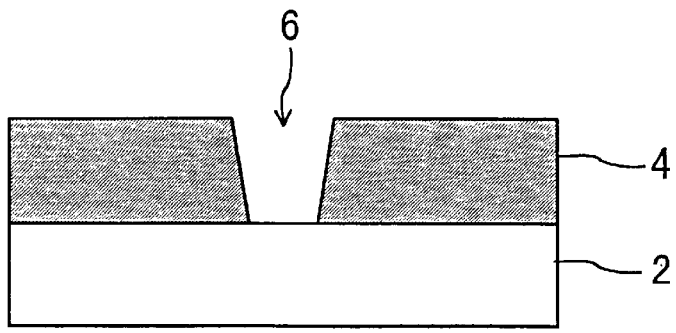
FIGS. 1A to 1K are cross-sectional views showing fabrication steps of an FET, according to a conventional method.
Figure 1B:
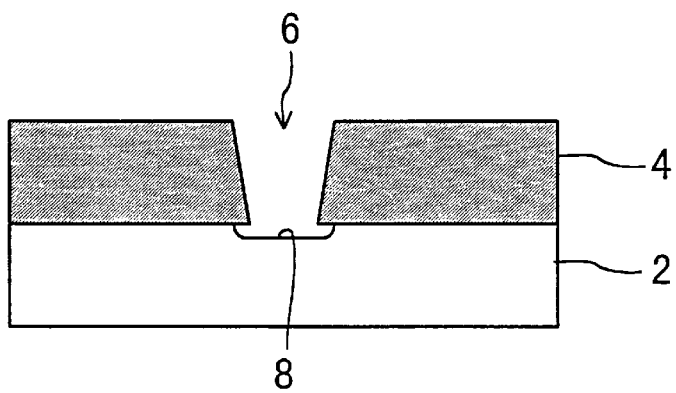

For better understanding of the invention, background technology is first described in conjunction with FIGS. 1A to 1K. In a conventional method for fabricating an FET, a semiconductor substrate 2 with an activated layer, is formed by an ion implantation process or a crystal growth process. Ohmic electrodes (not shown) are formed on the semiconductor substrate 2. Next, as shown in FIG. 1A, a first photo-resist layer 4 is formed on the semiconductor substrate 2 to have a first gate opening 6 therein. Subsequently, the semiconductor substrate 2 is etched using the first photo-resist layer 4 as a mask to form a recess etching surface 8 at the bottom of the first gate opening 6, as shown in FIG. 1B.

Figure 1C:
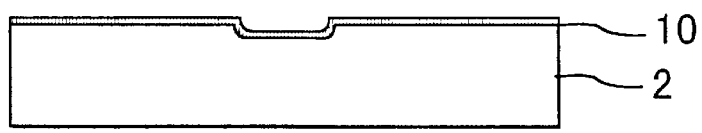
Figure 1D:
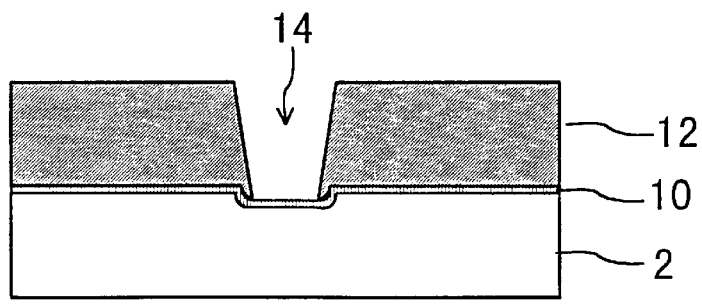

After that, as shown in FIG. 1C, the first photo-resist layer 4 is removed with an organic solvent, then an insulating layer 10 is evaporated over the surface of the semiconductor substrate 2. The insulating layer 10 may be of $Si_2$, $Si_3N_4$ or the like. Next, a second photo-resist layer 12 is formed on the insulating layer 10 to have a second gate opening 14 therein, as shown in FIG. 1D. The second photo-resist layer 12 is a chemically amplified type of resist.

Figure 1E:
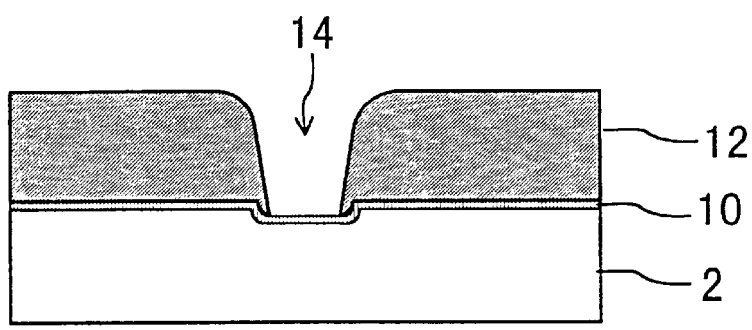
Figure 1F:
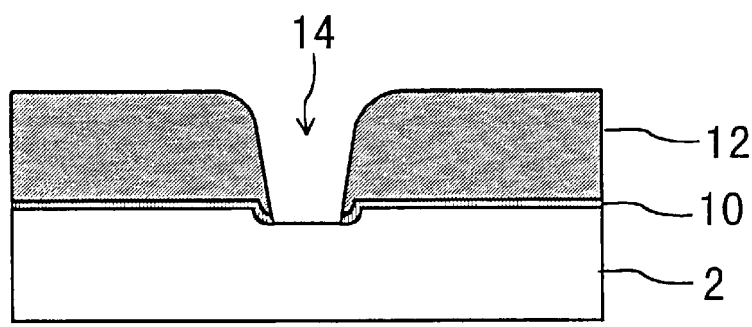

Subsequently, the second photo-resist layer 12 is heated to perform a reflow process to shape a curved surface thereon, as shown in FIG. 1E. Next, the insulating layer 10 at the bottom of the second opening 14 is removed by an RIE (Reactive Ion Etching) process, as shown in FIG. 1F, using the second photo-resist layer 12 as an etching mask.

Figure 1G:
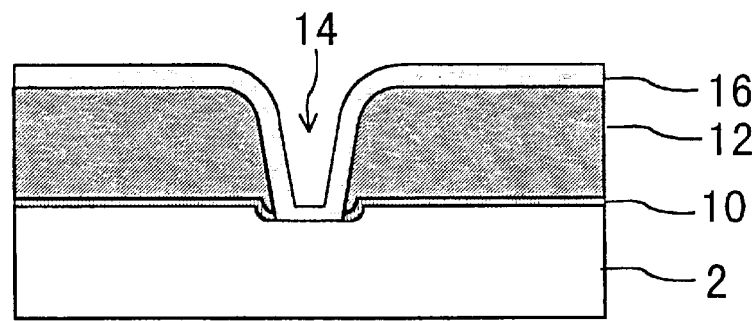
Figure 1H:
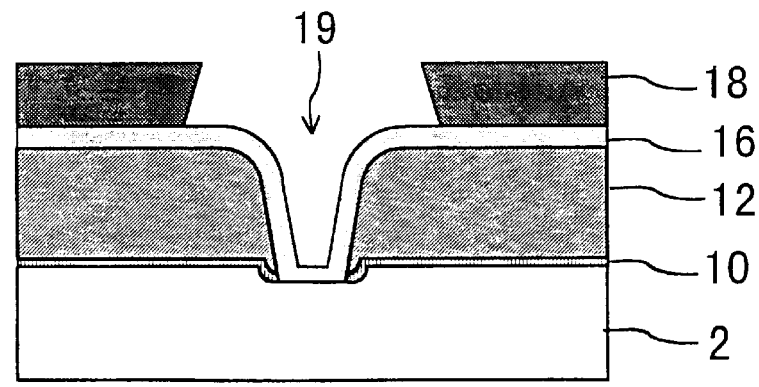
Figure 1I:
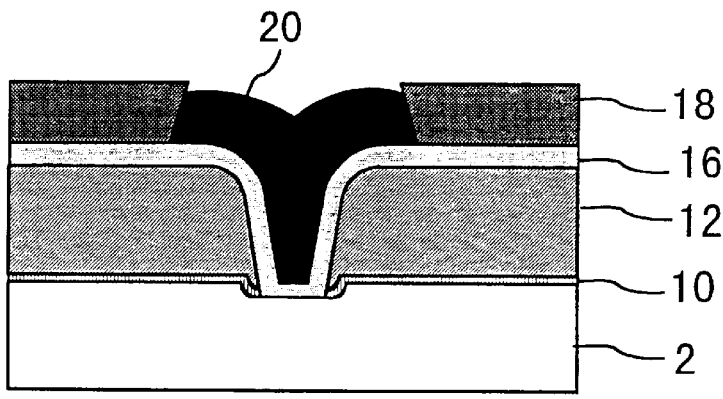

A first metal layer 16 is evaporated over the entire surface of the structure, as shown in FIG. 1G. Then, a third photo-resist layer 18 is formed on the first metal layer 16 to have a third gate opening 19 therein, as shown in FIG. 1H. Next, as shown in FIG. 1I, a second metal layer 20 is deposited in the third gate opening 19 by a metal plating process.

Figure 1J:
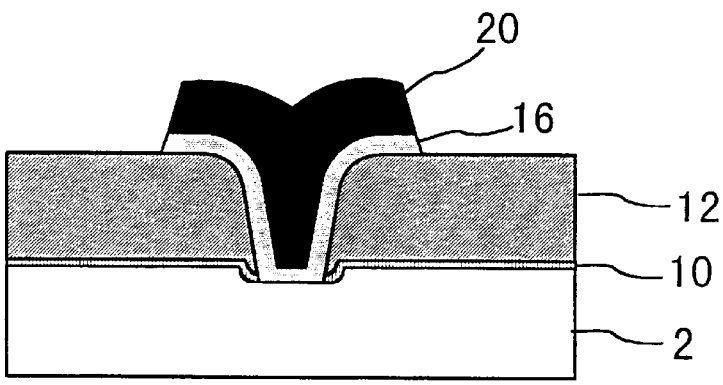
Figure 1K:
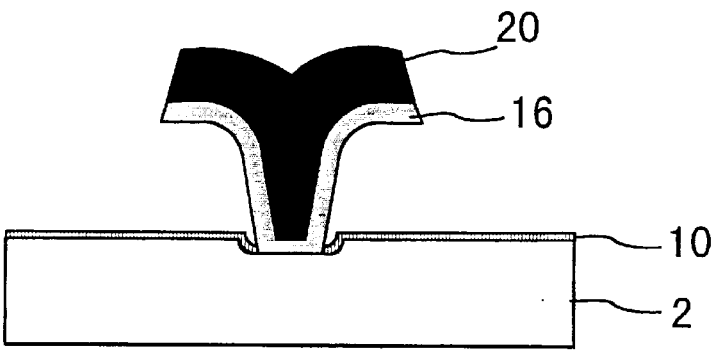

After that, the third photo-resist layer 18 is removed with an organic solvent, and the first metal layer 16 is selectively removed using the second metal layer 20 as a mask, as shown in FIG. 1J. In conclusion, as shown in FIG. 1K the second photo-resist layer 12 is removed with an organic solvent to make a complete gate electrode (16 and 20).

In the conventional technology, the chemical amplified resist is used as the second photo-resist layer 12, so that it is difficult to make the gate length less than 0.25 $\mu$m. For a semiconductor device used for a short wave transmission, it is required to have a gate electrode having a gate length of between about 0.10 to 0.15, $\mu$m. According to the conventional method, such a short gate length can not be obtained easily. In addition, the gate length may be changed during the reflow process and etching process. Because the insulating layer 10 is removed after the reflow-process, the gate length (channel length) may be changed during the step of removing the insulating layer 10. As a result, the pattern shift varies, and therefore, the characteristics of the semiconductor device may be varied.

According to the method described in Japanese Patent Laying Open, Kokai H5-160019, a gate electrode can be fabricated to have a short gate length. However, the pattern shift varies, and therefore, the characteristics of the semiconductor device may be varied device to device, in the same manner as the above described conventional method.

Figure 2A:
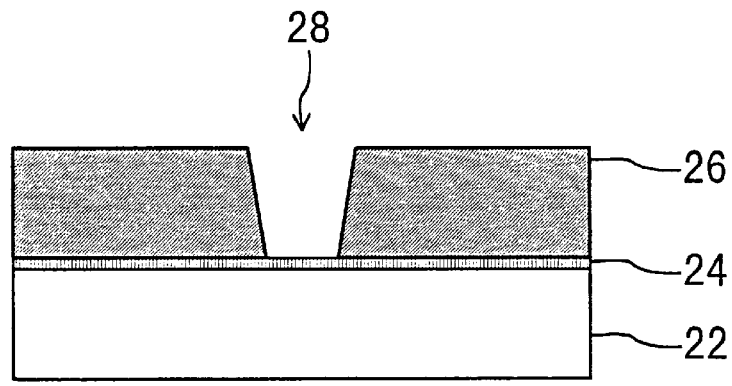
FIGS. 2A to 2C are cross-sectional views showing a part of fabrication steps of an FET, according to the invention.
Figure 2B:
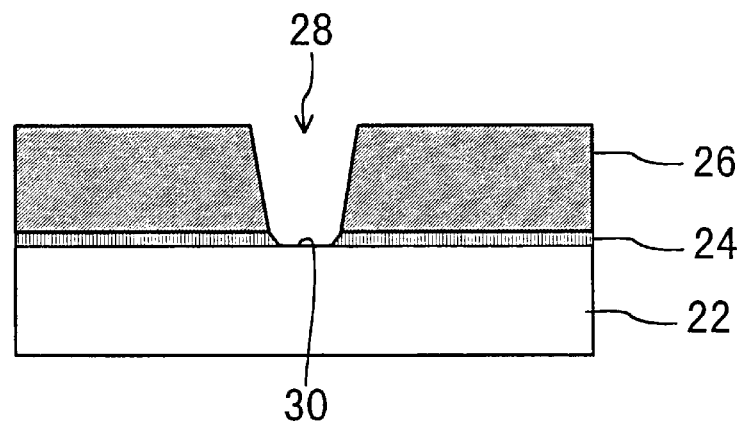
Figure 2C:
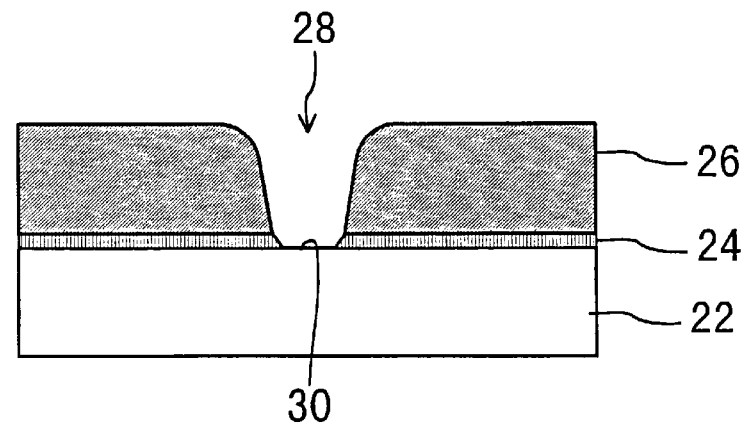

FIGS. 2A to 2C show a part of fabrication steps of an FET, according to the invention. In the invention, a semiconductor substrate 22 with an activated layer, is formed by an ion implantation process or a crystal growth process. Then a super thin insulating layer 24 is evaporated over the semiconductor substrate 22 to have a thickness of 100 Å. The insulating layer 24 may be of $SiO_2$ or $Si_3N_4$ and may have a thickness of 50 to 200 Å. Next, an EB (Electron Beam) resist layer 26 is formed on the insulating layer 24 to have an opening 28 therein. The opening 28 is shaped to have a diameter of 0.10 to 0.15 $\mu$m, as shown in FIG. 2A. The diameter will be corresponding to a gate length. The EB resist layer 26 is of an EB positive-resist #ZEP520 by Nippon Zeon Corp. and is shaped to have a thickness of 3000 Å.

Next, as shown in FIG. 2B, the insulating layer 24 at the bottom of the opening 28 is removed by an RIE (Reactive Ion Etching) process to form an open area 30. After that, as shown in FIG. 2C, the EB resist layer 26 is heated to perform a reflow process to make a curved surface thereon. In the reflow process, any depressed regions are not formed on the inside surface of the opening 28. Therefore, the open area 30, corresponding to a gate length, is not changed in size in the reflow process. As a result, the gate length becomes consistent device to device.

Figure 3A:
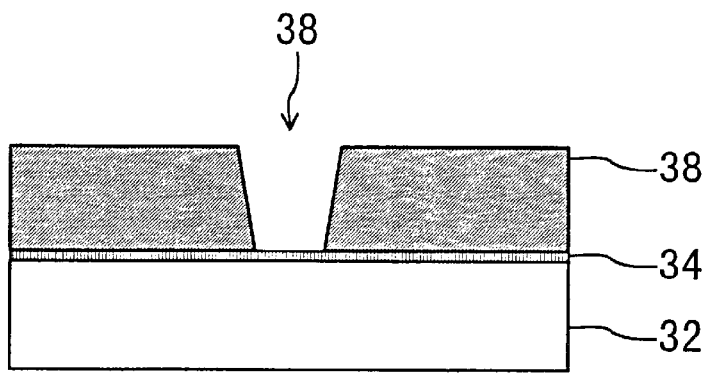
FIGS. 3A to 3C are cross-sectional views showing a part of fabrication steps of an FET, according to a conventional technology.
Figure 3B:
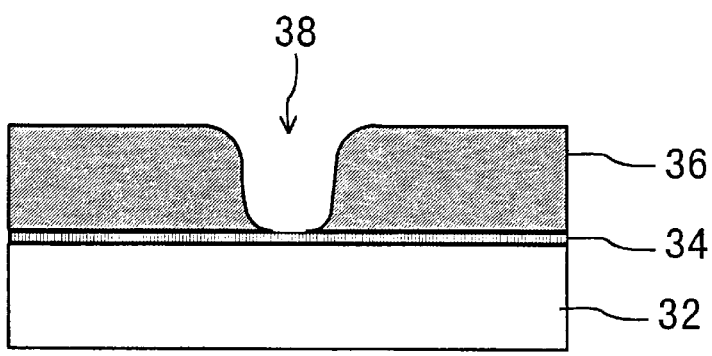
Figure 3C:
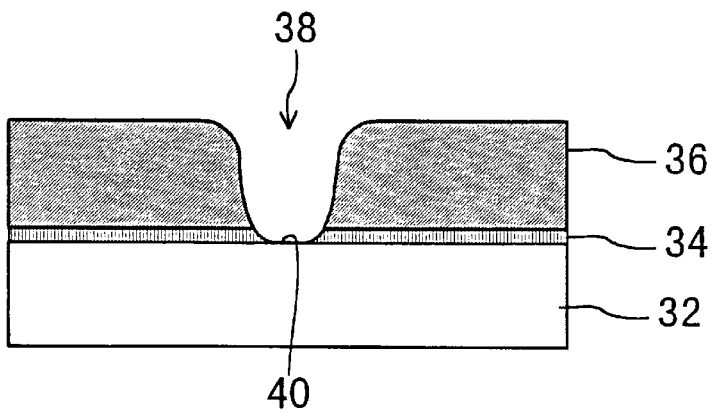

FIGS. 3A to 3C show a part of fabrication steps of an FET, according to the conventional technology. In the conventional method, a semiconductor substrate 32 with an activated layer, is formed by an ion implantation process or a crystal growth process. Then an insulating layer 34 is evaporated over the semiconductor substrate 32 to have a thickness of 100 Å. The insulating layer 24 is of $Si_3N_4$. Next, an EB (Electron Beam) resist layer 36 is formed on the insulating layer 34 to have an opening 38 therein. The opening 38 is shaped to have a diameter of 0.10 to 0.15 $\mu$m, as shown in FIG. 3A. The EB resist layer 36 is of an EB positive-resist #ZEP520 by Nippon Zeon Corp. and is shaped to have a thickness of 3000 Å.

Next as shown in FIG. 3B, the EB resist layer 36 is heated to perform a reflow process to make a curved surface thereon. In the reflow process, a depressed region is made on the inner surface of the opening 38, so that an area of the opening 38 at the interface between the EB resist layer 36 and the insulating layer 34 becomes narrower. After that, the insulating layer 34 at the bottom of the opening 38 is removed by an RIE process to form an open area 40.

According to the conventional method, a depressed region is made on the inner surface of the opening 38 in the reflow process, so that the open area 40 is changed in size. In addition, the reflow process to the EB resist layer 36 is performed before the insulating layer 34 is removed, so that the pattern shift may vary device to device.

In the reflow process of the resist layer, the pattern shift is affected by the adhesion (wettability) between the insulating layer and the resist layer and between the semiconductor substrate and the resist layer. In the conventional method, shown in FIGS. 3A to 3C, the EB resist layer 36 is reflowed not only the upper edge but the inside surface in the opening 38, because the insulating layer 34 and the EB resist layer 36 are well adhered. As a result, the inside surface of the EB resist layer 36 is shaped to be depressed, as shown in FIG. 3B. When the insulating layer 34 is removed at the bottom of the opening 38, the open area 40 is formed as shown in FIG. 3C. In other words, the open area 40, corresponding to a gate length, is changed in size from its original pattern, shown in FIG. 3A. In addition, the pattern shift becomes inconsistent from device to device.

On the other hand, according to the invention, shown in FIGS. 2A to 2C, the EB resist layer 26 is reflowed only at the upper edge, not at the bottom of the opening 28, because the reflow process is restricted by the insulating layer 24 at the bottom of the opening 28. It means that the EB resist layer 26 is not shaped to be depressed inside the opening 28. As a result, the pattern shift becomes consistent device to device. It is considered that such a phenomenon has occurred because the insulating layer 24 and the EB resist layer 26 are well adhered while the EB resist layer 26 and the semiconductor substrate 22 are not adhered well.

Figure 4A:
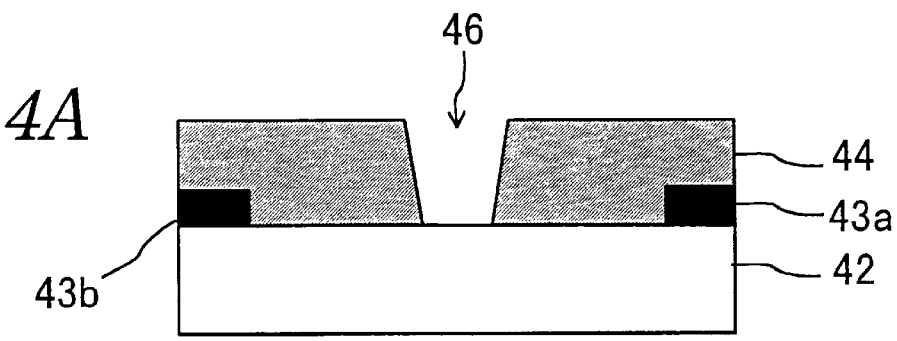
FIGS. 4A to 4K are cross-sectional views showing fabrication steps of an FET, according to a first preferred embodiment of the invention.
Figure 4B:
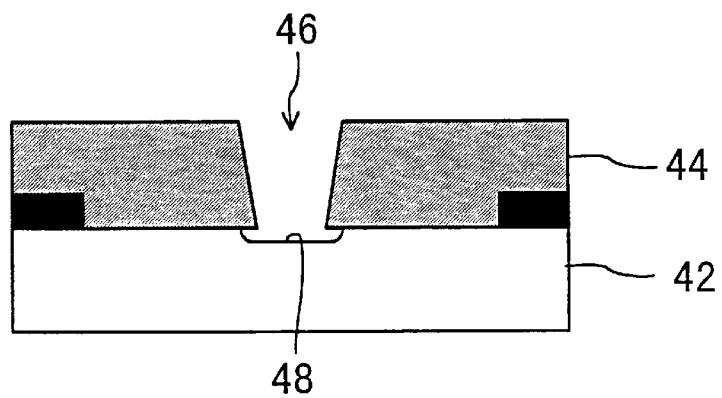

FIGS. 4A to 4K show the fabrication steps of an FET, according to a first preferred embodiment of the invention. In fabrication, a semiconductor substrate 42 with an activated layer, is formed by an ion implantation process or a crystal growth process. Then, ohmic electrodes 43a and 43b are formed on the semiconductor substrate 42. Next as shown in FIG. 4A, a first photo-resist layer 44 is formed on the semiconductor substrate 42 to have a first gate opening 46 therein. Subsequently, the semiconductor substrate 42 is etched using the first photo-resist layer 44 as a mask to form a recess etching surface 48 at the bottom of the first gate opening 46, as shown in FIG. 4B.

Figure 4C:
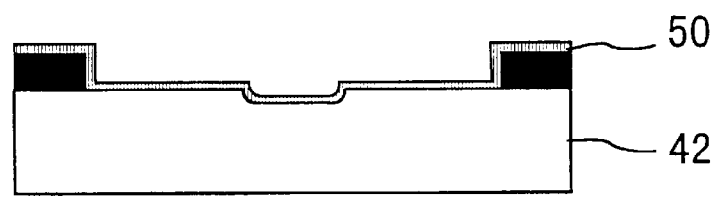
Figure 4D:
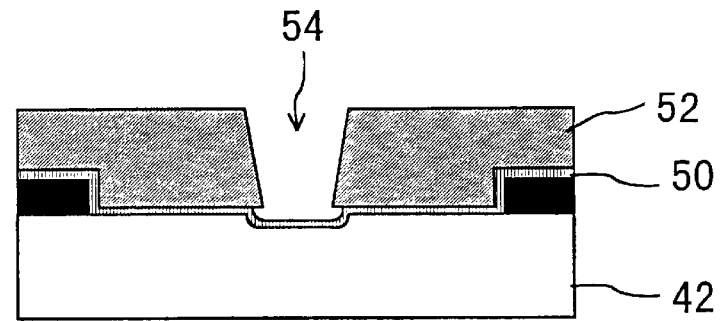

After that, as shown in FIG. 4C, the first photo-resist layer 44 is removed with an organic solvent, then an insulating layer 50 is evaporated over the surface of the semiconductor substrate 42 to have a thickness of 100 Å. The insulating layer 50 maybe of $SiO_2$, $Si_3N_4$ or the like and have a thickness of 50 to 200 Å. Next, an EB resist layer 52 is formed on the insulating layer 50 to have a second gate opening 54 therein, as shown in FIG. 4D. The second gate opening 54 is shaped to have a diameter of 0.10 to 0.15 μm, corresponding to a gate length. The EB resist layer 52 may be of an EB positive-resist #ZEP520 by Nippon Zeon Corp. and may be shaped to have a thickness of 3000 Å.

Figure 4E:
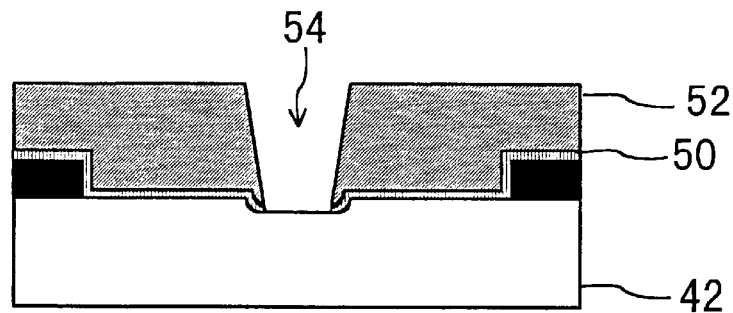
Figure 4F:
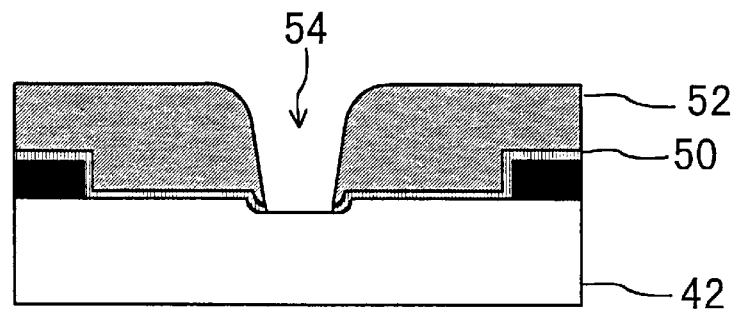

Subsequently, the insulating layer 50 at the bottom of the second gate opening 54 is removed by an RIE (Reactive Ion Etching) process, as shown in FIG. 4E, using the EB resist layer 52 as an etching mask. After that, the EB resist layer 52 is heated to perform a reflow process to shape a curved surface thereon, as shown in FIG. 4F.

Figure 4G:
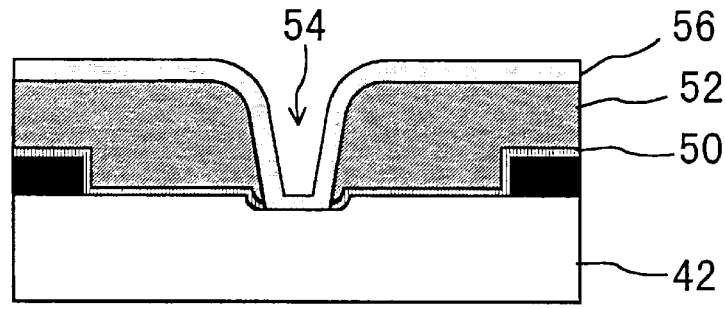
Figure 4H:
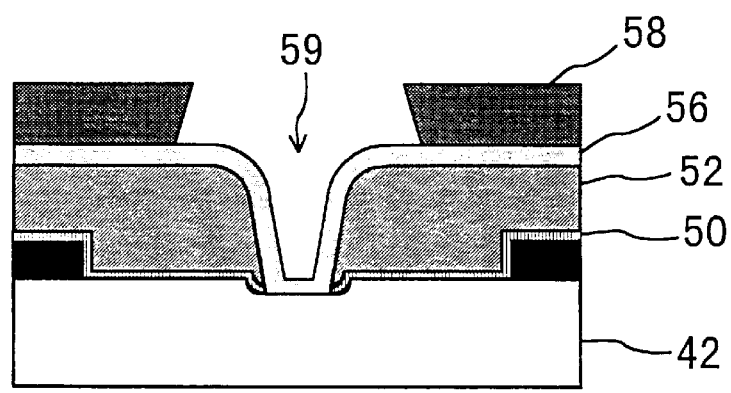
Figure 4I:
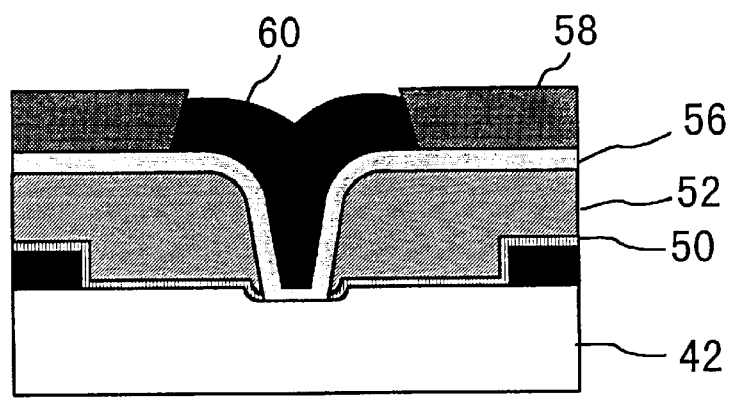

A first metal layer 56 is evaporated over the entire surface of the structure, as shown in FIG. 4G. Then, a second photo-resist layer 58 is formed on the first metal layer 56 to have a third gate opening 59 therein, as shown in FIG. 4H. Next, as shown in FIG. 4I, a second metal layer 60 is deposited in the third gate opening 59 by a metal plating process.

Figure 4J:
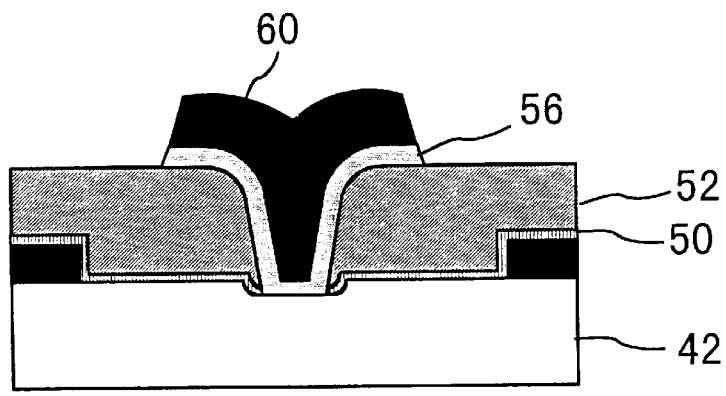
Figure 4K:
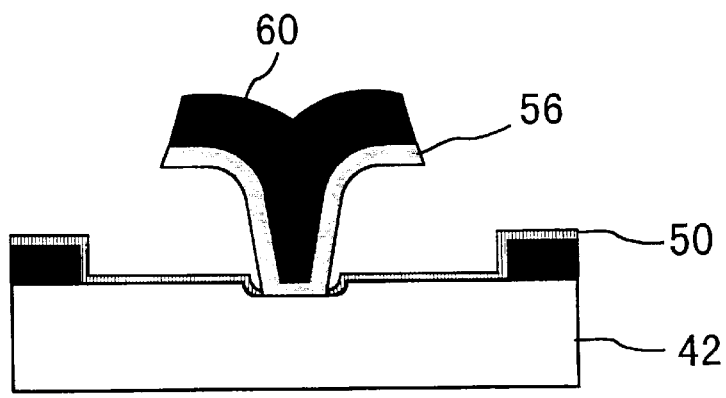

After that, the second photo-resist layer 58 is removed with an organic solvent, and the first metal layer 56 is selectively removed using the second metal layer 60 as a mask, as shown in FIG. 4J. In conclusion, as shown in FIG. 4K, the EB resist layer 52 is removed with an organic solvent to make a complete gate electrode (56 and 60).

In the first preferred embodiment, the EB resist layer 52 is used, so that the gate length can be controlled in a range of 0.10 to 0.15 μm. According to the embodiment, the insulating layer 50 is removed before the reflow process to the EB resist layer 52 is performed, so that the pattern shift becomes consistent device to device.

Figure 5A:
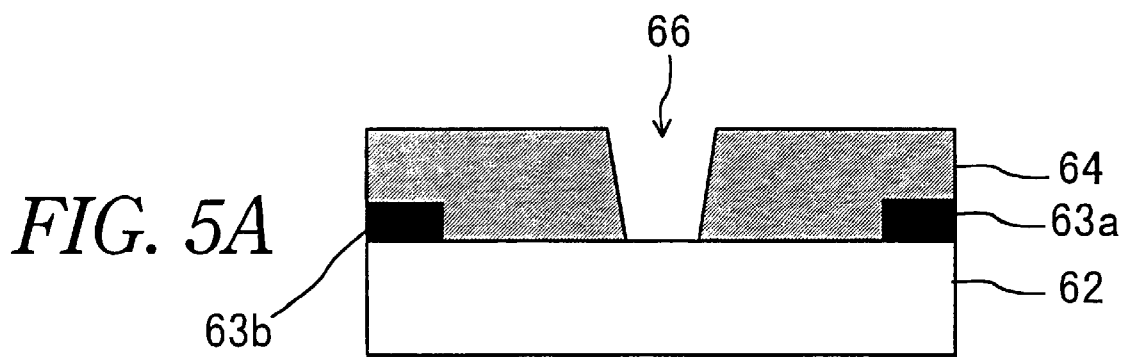
FIGS. 5A to 5I are cross-sectional views showing fabrication steps of an FET, according to a second preferred embodiment of the invention.

FIGS. 5A to 5I show the fabrication steps of an FET, according to a second preferred embodiment of the invention. The gate electrode (56 and 60) in the first preferred embodiment is fabricated by two steps of metallizing, on the other hand in the second preferred embodiment, a gate electrode (80) is fabricated by a single step of metallizing using double layered insulating films (72 and 76). In fabrication, a semiconductor substrate 62 with an activated layer, is formed by an ion implantation process or a crystal growth process. Then, ohmic electrodes 63a and 63b are formed on the semiconductor substrate 62. Next, as shown in FIG. 5A, a first photo-resist layer 64 is formed on the semiconductor substrate 62 to have a first gate opening 66 therein.

Figure 5B:
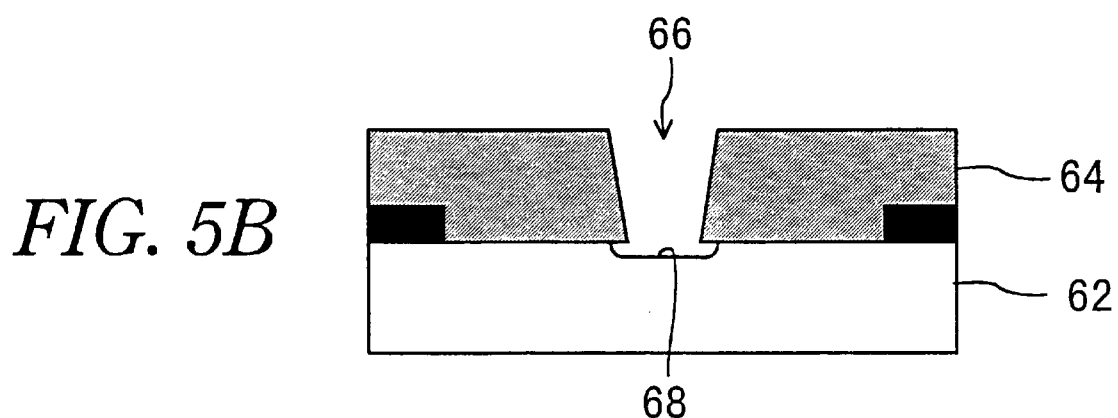
Figure 5C:
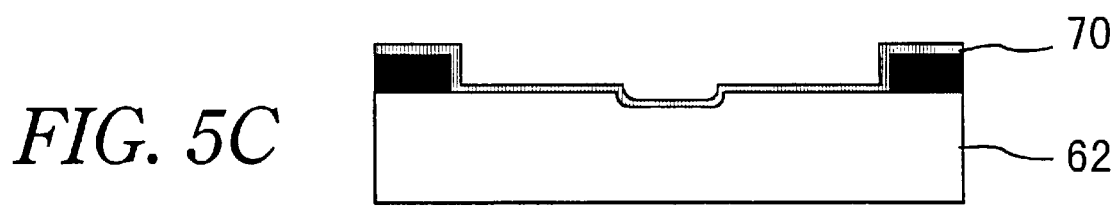
Figure 5D:
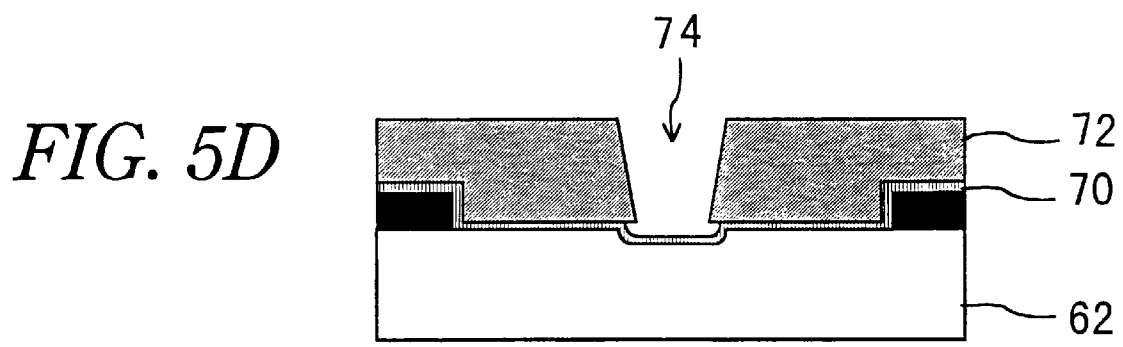

Subsequently, the semiconductor substrate 62 is etched using the first photo-resist layer 64 as a mask to form a recess etching surface 68 at the bottom of the first gate opening 66, as shown in FIG. 5B. After that, as shown in FIG. 5C, the first photo-resist layer 64 is removed with an organic solvent, then an insulating layer 70 is evaporated over the surface of the semiconductor substrate 62 to have a thickness of 100 Å. The insulating layer 70 may be of $SiO_2$, $Si_3N_4$ or the like and have a thickness of 50 to 200 Å. Next, an EB resist layer 72 is formed on the insulating layer 70 to have a second gate opening 74 therein, as shown in FIG. 5D. The second gate opening 74 is shaped to have a diameter of 0.10 to 0.15 μm, corresponding to a gate length. The EB resist layer 72 may be of an EB positive-resist #ZEP520 by Nippon Zeon Corp. and may be shaped to have a thickness of 3000 Å.

Figure 5E:
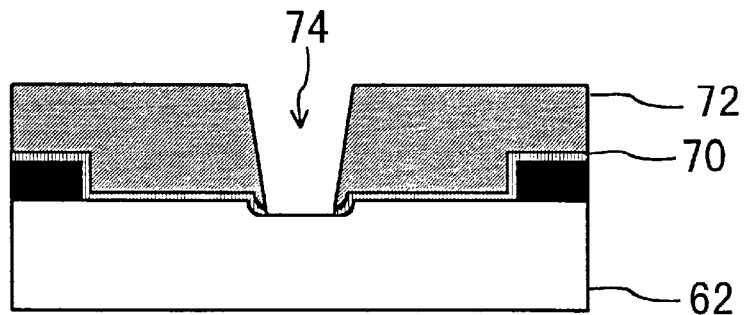
Figure 5F:
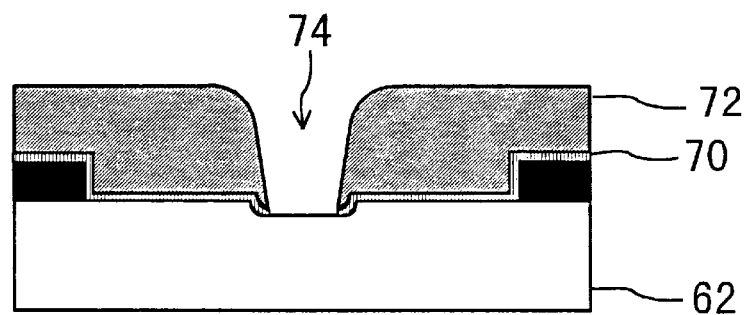

Subsequently, the insulating layer 70 at the bottom of the second gate opening 74 is removed by an RIE (Reactive Ion Etching) process, as shown in FIG. 5E, using the EB resist layer 72 as an etching mask. After that, the EB resist layer 72 is heated to perform a reflow process to shape a curved surface thereon, as shown in FIG. 5F.

Figure 5G:
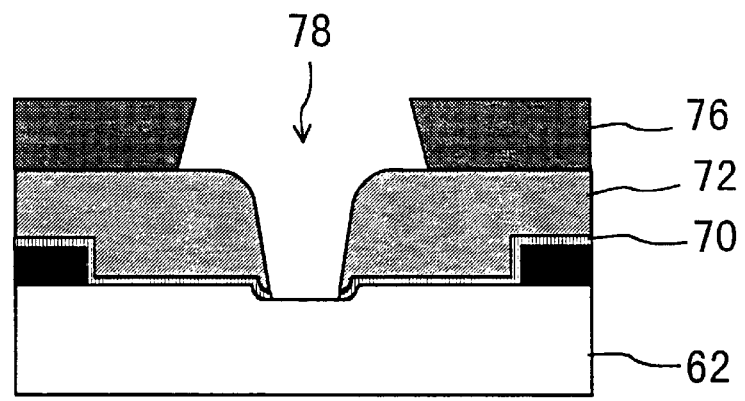
Figure 5H:
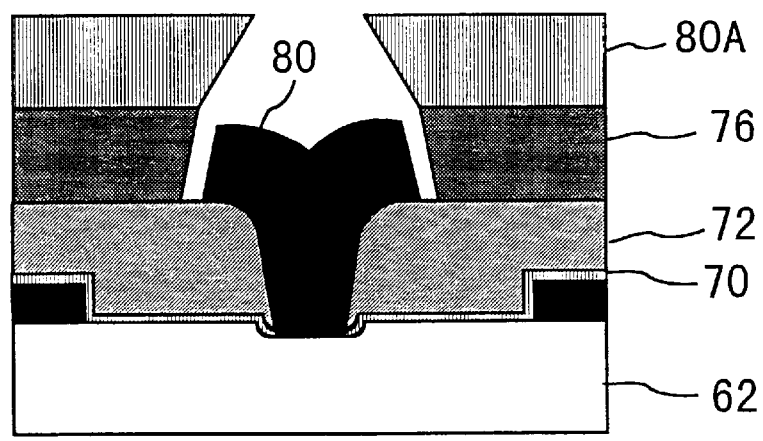
Figure 5I:
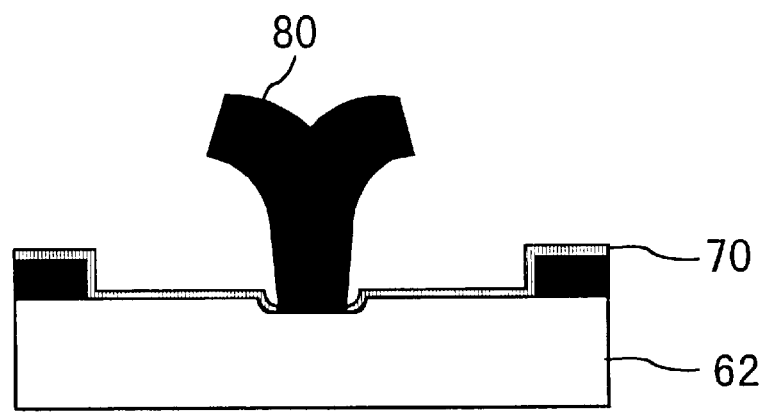

After the reflow process, a second photo-resist layer 76 is formed on the EB resist layer 72 to have a third gate opening 78 therein, as shown in FIG. 5G. The third gate opening 78 is shaped to be inverse-taperd. Next, as shown in FIG. 5H, a gate metal layer 80 is evaporated in the opening. On the second photo-resist layer 76, another gate metal layer 80A is formed. In conclusion, as shown in FIG. 5I, the EB resist layer 72, the second photo-resist layer 76 and the gate metal layer 80A are removed with an organic solvent to shape a complete gate electrode (80).

In the same manner as the first preferred embodiment, in the second preferred embodiment, the EB resist layer 72 is used, so that the gate length can be controlled in a range of 0.10 to 0.15 μm. In addition, the insulating lay 70 is removed before the reflow process to the EB resist layer 72, so that the pattern shift becomes consistent device to device.

It will be understood that the above description of the present invention is susceptible to various modifications, changes and adaptations, and the same are intended to be comprehended with the meaning and range of equivalents of the appended claims.

What is claimed is:

1. A method for fabricating a semiconductor device, comprising:
    providing a semiconductor substrate;
    forming insulating layer on the semiconductor substrate;
    forming a resist layer with an opening therein, on the insulating layer;
    removing the insulating layer at the bottom of the opening; and
    performing a reflow process on the resist layer subsequent to the removing the insulating layer, thereby to transform a surface of the resist layer to a curved surface.

2. The method, according to claim 1, wherein
    the resist layer is of an EB (Electron Beam) type, which is reactive to electron beams.

3. The method, according to claim 1, wherein the insulating layer is made of a material selected from the group consisting of $SiO_2$ and $Si_3N_4$, and wherein the insulating layer has a thickness in a range from 50 Å to 200 Å.

4. A semiconductor device that is fabricated by a method, the method comprising:
    providing a semiconductor substrate;
    forming insulating layer on the semiconductor substrate;
    forming a resist layer with an opening therein, on the insulating layer;
    removing the insulating layer at the bottom of the opening; and
    performing a reflow process on the resist layer subsequent to the removing the insulating layer, thereby to transform a surface of the resist layer to a curved surface.

5. The semiconductor device, according to claim 4, wherein
the resist layer is of an EB (Electron Beam) type, which is reactive to electron beams.

6. The semiconductor device, according to claim 4, wherein the insulating layer is made of a material selected from the group consisting of $SiO_2$ and $Si_3N_4$, and wherein the insulating layer has a thickness in a range from 50 Å to 200 Å.

7. A method for fabricating a field effect transistor (FET), comprising:
providing a semiconductor substrate;
forming an ohmic electrode on the semiconductor substrate;
forming a first resist layer with a first opening therein, over the entire surface the substrate;
etching the surface of the semiconductor substrate at the bottom of the first opening to form a recess-etching surface;
removing the first resist layer;
forming an insulating layer over the entire surface of the substrate;
forming a second resist layer with a second opening therein, over the entire surface of the substrate;
removing the insulating layer at the bottom of the second opening;
performing a reflow process on the second resist layer subsequent to the removing the insulating layer, thereby to transform a surface of the second resist layer to a curved surface; and
forming a gate electrode connected to the recess-etching surface of the semiconductor substrate.

8. The method, according to claim 7, wherein
the second resist layer is of an EB (Election Beam) type, which is reactive to electron beams.

9. The method, according to claim 7, wherein the insulating layer is made of a material selected from the group consisting of $SiO_2$ and $Si_3N_4$, and wherein the insulating layer has a thickness in a range from 50 Å to 200 Å.

10. The method, according to claim 7, wherein the forming the gate electrode includes:
(1) forming a first metal layer over the entire surface of the substrate;
(2) forming a third resist layer with a third opening therein, on the first metal layer;
(3) forming a second metal layer in the third opening;
(4) removing the third resist layer; and
(5) selectively removing the first metal layer to form the gate electrode of only the first and second metal layers.

11. The method, according to claim 7, wherein the forming the gate electrode includes:
(1) forming a third resist layer on the second resist layer;
(2) forming a metal layer in the second opening and in contact with the recess-etching surface of the semiconductor substrate; and
(3) removing the second and third resist layers to form the gate electrode of only the metal layer.

12. A field effect transistor (FET) that is fabricated by a method, the method comprising:
providing a semiconductor substrate;
forming an ohmic electrode on the semiconductor substrate;
forming a first resist layer with a first opening therein, over the entire surface the substrate;
etching the surface of the semiconductor substrate at the bottom of the first opening to form a recess-etching surface;
removing the first resist layer;
forming an insulating layer over the entire surface of the substrate;
forming a second resist layer with a second opening therein, over the entire surface of the substrate;
removing the insulating layer at the bottom of the second opening;
performing a reflow process on the second resist layer subsequent to the removing the insulating layer, thereby to transform a surface of the second resist layer to a curved surface; and
forming a gate electrode connected to the recess-etching surface of the semiconductor substrate.

13. The field effect transistor, according to claim 12, wherein
the resist layer is of an EB (Election Beam) type, which is reactive to electron beams.

14. The field effect transistor, according to claim 12, wherein the insulating layer is made of a material selected from the group consisting of $SiO_2$ and $Si_3N_4$, and wherein the insulating layer has a thickness in a range from 50 Å to 200 Å.

* * * * *